(12) United States Patent
Bhattacharya et al.

(10) Patent No.: US 6,992,489 B2
(45) Date of Patent: Jan. 31, 2006

(54) MULTIPLE VOLTAGE LEVEL DETECTION CIRCUIT

(75) Inventors: Dipankar Bhattacharya, Macungie, PA (US); John Christopher Kriz, Palmerton, PA (US); Joseph E. Simko, Slatington, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/776,778

(22) Filed: Feb. 11, 2004

(65) Prior Publication Data

US 2005/0174125 A1    Aug. 11, 2005

(51) Int. Cl.
*G01R 19/26* (2006.01)
*G01R 19/257* (2006.01)
(52) U.S. Cl. .................................... 324/522; 324/99 D
(58) Field of Classification Search ................ 324/522, 324/99 D, 103 P, 115, 429, 433; 327/51, 327/81
See application file for complete search history.

(56) References Cited

U.S. PATENT DOCUMENTS

| | | | | |
|---|---|---|---|---|
| 3,409,784 A | * | 11/1968 | Pommerening | 327/51 |
| 3,760,272 A | * | 9/1973 | Battes | 324/111 |
| 3,806,915 A | * | 4/1974 | Higgins et al. | 341/159 |
| 4,071,822 A | * | 1/1978 | Kamiya | 324/111 |
| 5,170,077 A | * | 12/1992 | Schreck | 327/51 |
| 5,859,461 A | * | 1/1999 | Bonaccio et al. | 257/402 |
| 6,236,243 B1 | * | 5/2001 | Takeshima | 327/88 |
| 6,639,424 B2 | * | 10/2003 | Bales | 326/63 |

* cited by examiner

*Primary Examiner*—Anjan Deb

(57) ABSTRACT

A circuit configurable for indicating a voltage level of an input signal applied to the circuit includes at least one transistor having a first terminal connected to a first voltage supply, a second terminal configured for receiving the input signal, and a third terminal operatively coupled to an output of the circuit. The circuit further includes a passive load connected between the third terminal of the transistor and a second voltage supply. The circuit is configured to generate an output signal at the output of the circuit. The output signal being at a first value indicates that the input signal is substantially at a first voltage level, and the output signal being at a second value indicates that the input signal is substantially at a second voltage level.

22 Claims, 2 Drawing Sheets

MULTIPLE VOLTAGE LEVEL DETECTION CIRCUIT

FIELD OF THE INVENTION

The present invention relates generally to voltage level detection, and more particularly relates to techniques for detecting multiple voltage levels in a circuit.

BACKGROUND OF THE INVENTION

In certain applications, including portable applications employing wireless handsets, circuitry utilized with such applications (e.g., input/output (IO) buffers, etc.) may be configured such that at least a portion of the circuitry runs off a battery supply while the rest of the circuitry runs off a separate power supply. Moreover, the battery supply may be required to operate at multiple voltage levels, such as, for example, 3.3 volts and 1.8 volts, with each voltage level having a specified tolerance (e.g., typically about ±10%) associated therewith. Such circuitry must generally meet predetermined design specifications at all operating voltages. In order to accomplish this, a voltage level detector is often used to identify which battery voltage level is being supplied to the circuit and to adjust the circuitry accordingly to meet the design specifications at the identified operating voltage.

One known technique for detecting the voltage level supplied to a circuit is shown in FIG. 1. A battery voltage VBAT is applied to the gate terminals (G) of a p-type metal-oxide-semiconductor (PMOS) transistor MP1 and an n-type MOS (NMOS) transistor MN1. A source terminal (S) of transistor MP1 is connected to the positive voltage supply VDD and a drain terminal (D) of MP1 is connected to the drain terminal (D) of transistor MN1. The source terminal (S) of MN1 is connected to the negative voltage supply VSS. Transistors MP1 and MN1 are thus configured as a standard inverter, with the gate terminals of MP1 and MN1 forming an input of the inverter and the drain terminals of MP1 and MN1 forming an output of the inverter at node N1.

The switching point of the inverter is typically skewed, for example, by adjusting the ratio of the channel widths and/or lengths of the two transistors MP1 and MN1, such that when the input voltage VBAT is 1.8 volts, it will be treated as a logical "0." Subsequent stages of inverters (e.g., inverter 102) are sometimes added to generate an output that is a logical "1" when VBAT is 3.3 volts and a logical "0" otherwise.

A primary disadvantage with this conventional approach, however, is that the voltage level detector often fails when there is a voltage mismatch between the battery voltage VBAT and the positive voltage supply VDD. For example, if VDD is 10% higher than the 3.3 volt nominal operating voltage (i.e., 3.6 volts) and VBAT is 10% lower than the 3.3 volt nominal voltage (i.e., 3.0 volts), transistor MP1 may pull the output node N1 high due to sub-threshold operation of MP1 and also because transistor MN1 is often made weak in order to skew the switching point of the inverter. This will cause the output Z of the voltage level detection circuit to be a logical "0," erroneously indicating that the lower voltage level of 1.8 volts is present when, in fact, the output should be a logical "1" indicating a 3.3 volt level of operation. Likewise, when VBAT is 1.8 volts, MP1 is turned on and MN1 is not completely turned off, thus dissipating substantial current in the circuit. In order to reduce this current and raise the switching point of the inverter, the channel length of transistor MN1 can be made substantially long compared to the channel length of transistor MP1. However, the long channel length transistor MN1 would occupy significant semiconductor area and is thus undesirable. Moreover, the high switching point of the inverter significantly reduces a noise margin of the circuit.

There exists a need, therefore, for an improved circuit for detecting multiple voltage levels that does not suffer from one or more of the problems exhibited by conventional voltage level detection circuitry.

SUMMARY OF THE INVENTION

The present invention meets the above-noted need by providing, in an illustrative embodiment, improved techniques for detecting multiple voltage levels applied to a circuit.

In accordance with one aspect of the invention, a circuit configurable for indicating a voltage level of an input signal applied to the circuit includes at least one transistor having a first terminal connected to a first voltage supply, a second terminal configured for receiving the input signal, and a third terminal operatively coupled to an output of the circuit. The circuit further includes a passive load connected between the third terminal of the transistor and a second voltage supply. The circuit is configured to generate an output signal at the output of the circuit. The output signal being at a first value indicates that the input signal is substantially at a first voltage level, and the output signal being at a second value indicates that the input signal is substantially at a second voltage level.

In accordance with another aspect of the invention, the voltage level detection circuit further includes a voltage level shift circuit connected between the first voltage supply and the first terminal of the at least one transistor. The voltage level shift circuit is operative to generate a voltage drop between the first voltage supply and the first terminal of the at least one transistor. The voltage level shift circuit may be configurable for receiving a control signal, the voltage level shift circuit being operative to selectively vary the voltage drop in response to the control signal.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of an illustrative voltage level detection circuit. It should be understood, however, that the present invention is not limited to this or any particular voltage level detection circuit arrangement. Rather, the invention is more generally applicable to improved techniques for detecting multiple voltage levels applied to a circuit. Furthermore, although implementations of the present invention are described herein with specific reference to PMOS and NMOS transistor devices, as may be formed using a complementary metal-oxide-semiconductor (CMOS) fabrication process, it is to be appreciated that the invention is not limited to such transistor devices and/or such a fabrication process, and that other suitable devices, such as, but not limited to, bipolar junction transistors (BJTs), etc., may be similarly employed, as will be understood by those skilled in the art.

Figure 1:
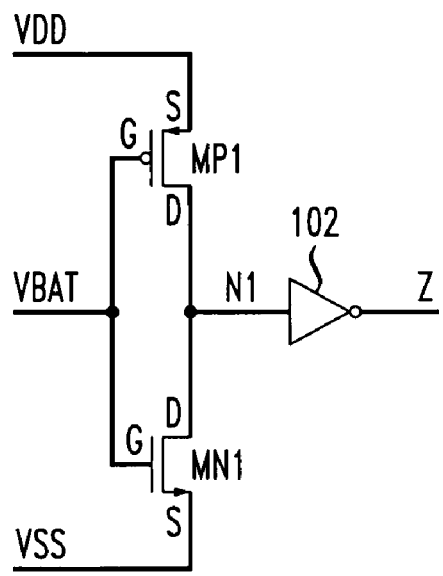
FIG. 1 is a schematic diagram illustrating a conventional voltage level detection circuit.

As previously stated, one method for detecting multiple voltage levels in a circuit, an example of which is shown in FIG. 1, typically relies on sensing the output of an inverter configured to have a substantially skewed switching point associated therewith. For example, with reference to FIG. 1, while a standard inverter may be designed to switch its output state at an input voltage of about one half of the supply voltage (e.g., VDD/2), the skewed inverter in the conventional voltage level detection circuit maybe designed to switch at an input voltage of substantially greater than one half of the supply voltage (e.g., ¾×VDD). In order to accomplish this, a ratio of the gate widths and/or lengths of the PMOS and NMOS transistors forming the inverter are set accordingly to provide the desired switching point.

A primary disadvantage with this approach, however, is that when there is a voltage mismatch between the input voltage to be detected (e.g., VBAT) and the positive supply voltage (e.g., VDD), transistor MP1 may be turned on due to sub-threshold operation such that even when the input voltage VBAT is within the tolerance of the upper voltage level, namely, 3.3 volts, node N1 may be pulled high, resulting in a logical "0" at the output Z of the circuit. The logical "0" output erroneously indicates that the input voltage detected is at the 1.8 volt level. As an additional disadvantage, both transistor devices MP1 and MN1 in the inverter may be turned on, thereby dissipating a significant amount of current in the circuit, as previously explained. This is unacceptable, particularly in portable devices which are often battery operated. While the current dissipated in the standard voltage level detection circuit can be reduced, at least in part, by making the gate length of the NMOS transistor MN1 substantially longer than the gate length of the PMOS transistor MP1, this approach generally consumes substantial semiconductor area. Furthermore, the skewed switching point of the inverter significantly reduces the noise margin of the conventional voltage level detection circuit and is therefore undesirable.

Figure 2:
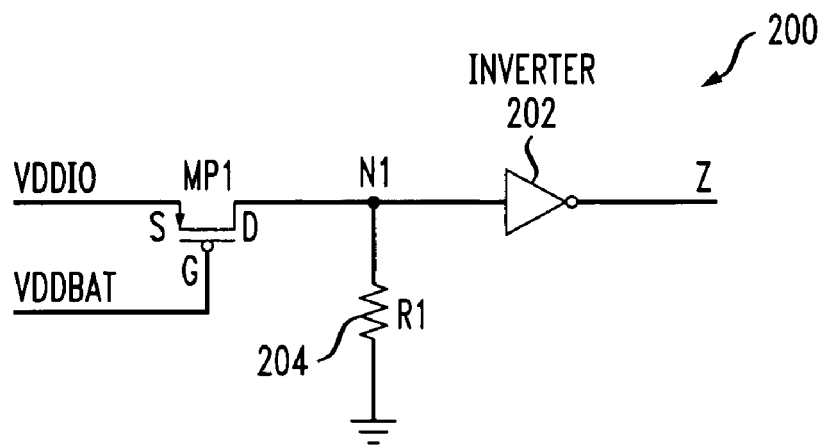
FIG. 2 is a schematic diagram depicting an illustrative voltage level detection circuit, formed in accordance with one embodiment of the present invention.

FIG. 2 is a schematic diagram illustrating an exemplary voltage level detection circuit 200 in which the techniques of the present invention are implemented. The illustrative voltage level detection circuit of the present invention provides a simple and robust solution that is capable of elegantly handling voltage mismatches between an input voltage applied to the circuit and a positive voltage supply of the circuit. Voltage level detection circuit 200 includes a PMOS transistor MP1 connected in a series configuration between a positive voltage supply of the circuit and an output of the circuit. Specifically, a source terminal (S) of transistor MP1 is connected to the positive voltage supply, which may be VDDIO, and a drain terminal (D) of MP1 forms the output of the circuit at node N1. A gate terminal (G) of transistor MP1 forms an input of the detection circuit 200 to which a voltage to be detected, which may be VDDBAT, can be applied.

It is to be appreciated that, in the case of a simple MOS device, because the MOS device is symmetrical in nature, and thus bidirectional, the assignment of source and drain designations in the MOS device is essentially arbitrary. Therefore, the source and drain regions may be referred to generally as first and second source/drain regions, respectively, where "source/drain" in this context denotes a source region or a drain region.

The exemplary voltage level detection circuit 200 further includes a resistor 204, or a suitable alternative passive load, connected between node N1 and a negative voltage supply of the circuit, which may be ground. The resistor 204 has a resistance value R1 associated therewith and functions, at least in part, as a pull-down device for defining node N1 when transistor MP1 is turned off. Therefore, when MP1 is turned off, node N1 will be a logical "0." The value R1 of the resistor 204 is preferably selected so that when transistor MP1 is turned on, thereby pulling node N1 up to about VDDIO, the current flowing through the resistor is essentially insignificant (e.g., about one microampere). Thus, assuming a positive voltage supply VDDIO of about 3.3 volts, R1 may be chosen to be about 3.3 megohms. Furthermore, R1 is preferably selected such that node N1 is held at a logical "0" state when transistor MP1 is in a sub-threshold region of operation, which may occur when the circuit 200 is operating at upper and lower limits of the voltage tolerances for the positive voltage supply VDDIO and input voltage VDDBAT, respectively (e.g., VDDIO is about 3.6 volts and VDDBAT is about 3.0 volts). In this manner, an erroneous voltage level indication generated at the output of the circuit 200 can be beneficially eliminated.

The exemplary voltage level detection circuit 200 may further include an inverter 202 having an input connected to node N1. The inverter 202 serves, at least in part, to buffer the signal generated at node N1 so as to enable the circuit 200 to more easily drive capacitive loads to which the circuit may be connected. Additionally, the inverter 202 preferably provides an output signal Z at an output of the inverter having voltage levels that are more compatible with standard logical levels. Since the exemplary voltage level detection circuit 200 does not require an inverter having a skewed switching point, a noise margin of the circuit is advantageously improved in comparison to standard voltage level detection methodologies. It is to be understood that, while an inverter 202 is shown, alternative circuitry, such as, for example, a buffer circuit (not shown), may be employed for enabling the circuit 200 to more easily drive external loads that may be connected thereto. Moreover, although inverting the signal generated at node N1 may provide a more advantageous indication of the voltage level of the input signal VDDBAT, it is to be appreciated that such signal inversion is not a requirement of the present invention.

By way of example only, operation of the voltage level detection circuit 200 will now be described. In this example, it is assumed that the positive voltage supply VDDIO is 3.3 volts with a tolerance of ±10%. It is also assumed that the input signal VDDBAT to be detected can be at one of two possible voltage levels, namely, 1.8 volts or 3.3 volts, with a tolerance of ±10%. Thus, the expected range of VDDIO is 3.0 volts to 3.6 volts, the range of the first level of VDDBAT is 1.62 volts to 1.98 volts, and the range of the second level of VDDBAT is 3.0 volts to 3.6 volts.

When the input signal VDDBAT is at the 1.8 volt level, transistor MP1 is turned on, thereby making node N1 substantially equal to VDDIO, about 3.3 volts. This will result in a logical "0" being generated at the output of the inverter 202. Since the resistance value R1 of passive load 204 is substantially high (e.g., about 3.3 megohms), the current flowing from node N1 to ground will be relatively small (e.g., about one microampere), thus eliminating one of the disadvantages associated with conventional voltage level detection methodologies. When input signal VDDBAT is at the 3.3 volt level, transistor MP1 is turned off, thereby allowing passive load 204 to pull node N1 down to substantially zero volts. This will result in a logical "1" being generated at the output of inverter 202.

In the voltage mismatch case, wherein the positive voltage supply VDDIO is at the maximum tolerance limit (e.g., 3.6 volts) and the input signal VDDBAT is at the minimum tolerance limit (e.g., 3.0 volts), if the resistance value R1 of resistor 204 is selected so as to minimize current consumption in the circuit, node N1 may be pulled high enough to generate a logical "0" at the output of the inverter 202 due, at least in part, to sub-threshold conduction of transistor MP1. In this instance, the circuit 200 may provide an erroneous voltage level indication. In order to eliminate this potential problem, the exemplary voltage level detection circuit 200 may be modified, as shown in FIG. 3.

Figure 3:
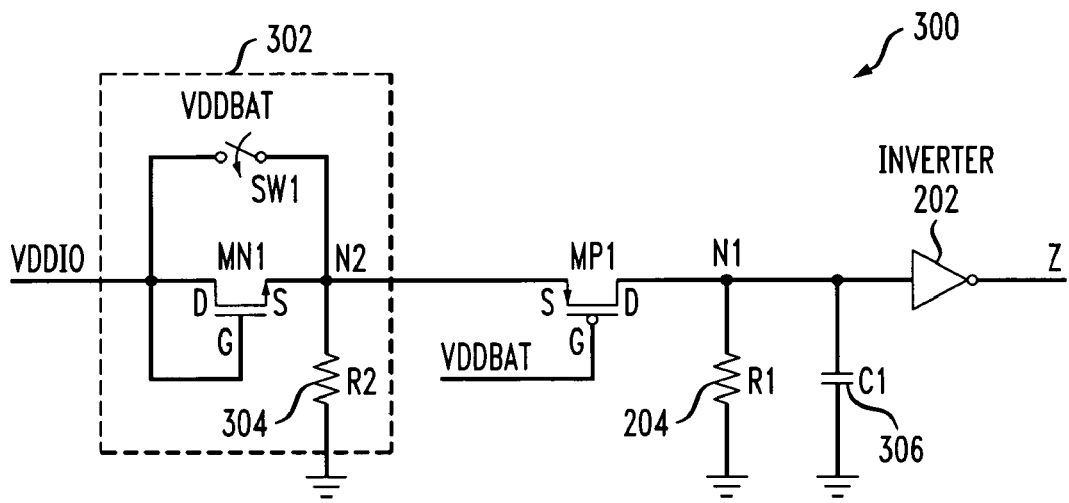
FIG. 3 is a schematic diagram illustrating an exemplary voltage level detection circuit, formed in accordance with another embodiment of the invention.

With reference to FIG. 3, an exemplary voltage level detection circuit 300 is shown, in accordance with a preferred embodiment of the present invention. As apparent from the figure, the exemplary circuit 300 is similar to circuit 200 described above, except that circuit 300 has been modified to handle the voltage mismatch problem by including a voltage level shifter 302 for reducing the amount of voltage at the source terminal of transistor MP1. The voltage level shifter 302 is preferably connected in series between the positive voltage supply VDDIO and the source terminal of transistor MP1. Voltage level shifter 302 is preferably configured to provide a voltage drop which is substantially equal to a maximum difference between the positive voltage supply and the upper voltage level of the input signal VDDBAT, which can be determined as a difference between the maximum tolerance limit of the positive voltage supply (e.g., 3.6 volts) and the minimum tolerance limit of the upper voltage level of the input signal (e.g., 3.0 volts), in this case, about 0.6 volts.

Voltage level shifter 302 may comprise, for example, a second transistor, which may be an NMOS transistor MN1, connected in a diode configuration, namely, including a drain terminal (D) and a gate terminal (G) connected to the positive voltage supply VDDIO, and a source terminal (S) connected to the source terminal of the first transistor MP1 at node N2. It is to be appreciated that an alternative circuit or device may be employed in place of, or in conjunction with, transistor MN1 for providing a desired voltage drop, such as, but not limited to, a diode-configured BJT device, as will be understood by those skilled in the art. The voltage level shifter 302 may further comprise a resistor 304 having a resistance value R2 connected between node N2 and ground for providing a current path to ground which ensures that a diode drop is generated across transistor MN1. The resistance value R2 is preferably selected such that only minimal current (e.g., about one microampere) flows through resistor 304 when the positive voltage supply VDDIO is at its maximum level. Assuming a positive voltage supply VDDIO of about 3.3 volts and a voltage drop across MN1 to be about 0.7 volts, R2 may be chosen to be about 2.6 megohms. Other values could of course be used.

By way of example only, operation of the exemplary voltage level detection circuit 300 will now be described. As in the example previously discussed in conjunction with FIG. 2, it is assumed that the positive voltage supply VDDIO is 3.3 volts with a tolerance of ±10%. It is also assumed that the input signal VDDBAT to be detected can be at one of two possible voltage levels, namely, 1.8 volts or 3.3 volts, with a tolerance of ±10%. Thus, the expected range of VDDIO is 3.0 volts to 3.6 volts, the range of the first level of VDDBAT is 1.62 volts to 1.98 volts, and the range of the second level of VDDBAT is 3.0 volts to 3.6 volts.

In the voltage mismatch case, wherein the positive voltage supply VDDIO is at the maximum tolerance limit (e.g., 3.6 volts) and the input signal VDDBAT is at the minimum tolerance limit (e.g., 3.0 volts), node N2 will be at a diode drop below VDDIO, or about 2.9 volts. This voltage drop will be determined, at least in part, by a threshold voltage associated with transistor MN1. With the input signal VDDBAT at 3.0 volts, transistor MP1 is turned off and resistor 204 pulls node N1 down to substantially zero volts. Inverter 202 may be connected to node N1 for providing an output signal Z which is a logical "1," thereby correctly indicating that input signal VDDBAT is at the upper voltage level.

In the case where the positive voltage supply VDDIO is at its minimal tolerance limit (e.g., 3.0 volts) and the input signal VDDBAT is at the maximum tolerance limit of its lower voltage level (e.g., 1.98 volts), the voltage across the source and gate terminals of transistor MP1 may be less than a threshold voltage of MP1. In this instance, transistor MP1 would be turned off and node N1 would be pulled to ground, thereby providing an erroneous indication at the output of the voltage level detection circuit 300. To solve this potential problem, a switch SW1, or alternative switching arrangement, is provided in the voltage level shifter 302 for operatively bypassing the voltage drop in response to the input signal VDDBAT being at the lower voltage level.

As shown in the figure, switch SW1 is preferably connected across transistor MN1 and configured so as to selectively shunt MN1 in response to the input signal. Specifically, when input signal VDDBAT is at the lower voltage level (e.g., 1.8 volts), switch SW1 is closed, thereby connecting node N2 to the positive voltage supply VDDIO. Since the minimum tolerance limit for the positive voltage supply VDDIO is preferably more than a threshold voltage above the maximum tolerance limit established for the lower voltage level of the input signal VDDBAT, bypassing the voltage drop generated by transistor MN1 ensures that transistor MP1 is turned on, thus providing the correct output indication from circuit 300.

In a preferred embodiment of the invention, switch SW1 may comprise a PMOS transistor (not shown) having a source terminal connected to the positive voltage supply VDDIO, a drain terminal connected to node N2, and a gate terminal connected to the input signal VDDBAT. It is to be appreciated that alternative means for bypassing the voltage drop generated by voltage level shifter 302 are similarly contemplated by the present invention. Moreover, it is contemplated that the voltage level shifter 302 may be configurable for receiving a control signal and may be operative to selectively vary the amount of voltage drop generated by the voltage level shifter in response to the control signal, in essence providing a programmable voltage level shift circuit.

In order to increase a robustness of circuit 300 against noise, and thereby increase the noise margin of the circuit, a capacitor 306 having a capacitance C1 associated therewith may be connected in parallel with resistor 204, namely, between node N1 and ground. Capacitor 306 functions, at least in part, as a low pass filter having a −3 decibel (dB) point established at a frequency of about $1/(2\pi \cdot R1 \cdot C1)$, as will be understood by those skilled in the art. Thus, knowing the resistance R1 of resistor 204 and the desired −3 dB frequency, the capacitance value C1 of capacitor 306 can be easily chosen. An additional capacitor (not shown) may be similarly connected in parallel with resistor 304, namely, between node N2 and ground to provide a further beneficial increase in the noise margin of circuit 300.

The techniques of the present invention, while illustrated using a positive voltage of 3.3 volts and using two specific voltage levels for the input signal, namely, 1.8 volts and 3.3 volts, is not limited to any particular voltage levels for the positive voltage supply and/or input signal, with or without modification to the exemplary voltage level detection circuit 300 described herein. Furthermore, the present invention is not limited to detecting only two voltage levels associated with the input signal. Rather, the techniques of the present invention may be similarly utilized to detect more than two voltage levels of the input signal, for example, by modifying the exemplary circuit 300 to include two or more outputs for indicating which one of a plurality of voltage levels the input signal may be operating at.

Figure 4:
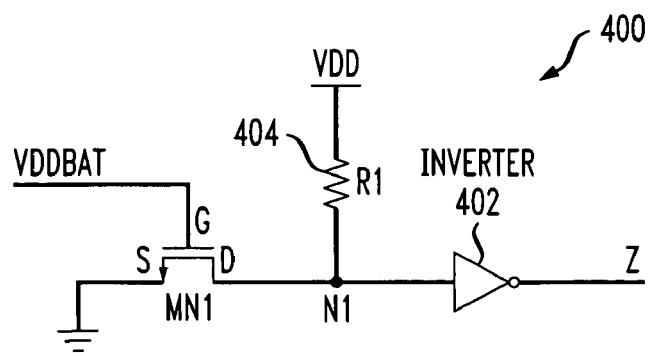
FIG. 4 is a schematic diagram illustrating an exemplary voltage level detection circuit, formed in accordance with an alternative embodiment of the invention.

The exemplary circuits shown in FIGS. 2 and 3 are particularly well-suited for applications in which one of the input voltage levels to be detected is at or near the positive voltage supply (e.g., about 3.3 volts), so as to turn off PMOS transistor MP1, and the other input voltage level is substantially below the positive voltage supply (e.g., 1.8 volts), but may not be below an NMOS transistor threshold (e.g., typically about 0.8 volts). The present invention contemplates, however, that the circuits shown in FIGS. 2 and 3 may be modified for use in applications where it is necessary to detect input voltage levels at or near the negative voltage supply, such as, but not limited to, 0.5 volts and 2.0 volts, which would otherwise cause PMOS transistor MP1 to remain turned on for either of the input voltage levels. In an alternative embodiment of the invention, the voltage level detection circuit 200 shown in FIG. 2 may be modified so as to obtain an exemplary voltage level detection circuit 400 depicted in FIG. 4.

In circuit 400, the PMOS transistor has been replaced by an NMOS transistor MN1 having a source (S) terminal connected to the negative voltage supply, which may be ground, a gate (G) terminal forming an input of the circuit to which a signal VDDBAT to be detected can be applied, and a drain (D) terminal forming an output of the circuit at node N1. The pull-down resistor 204 shown in FIG. 2 has been replaced by a pull-up resistor 404 having a resistance R1 connected between the drain terminal of transistor MN1 and the positive voltage supply, which may be VDD. As in the case of resistor 204 of FIG. 2, the resistance R1 of resistor 404 may be chosen to be substantially high, such as, for example, 3.3 megohms, in order to minimize current dissipation in the circuit. Other values could of course be used. Circuit 400 may also include an inverter 402 (or a buffer) connected to node N1 for providing logic level outputs at node Z.

Voltage level detection circuit 400 functions in a manner similar to circuit 200 previously described in conjunction with FIG. 2, except that circuit 400 is configured to detect a different voltage level range of the input signal VDDBAT, such as, for example, 0.5 volts and 2.0 volts. When input signal VDDBAT is at 0.5 volts, transistor MN1 will be turned off and node N1 will be pulled to VDD by resistor 404. Node Z will thus be at a logical "0." Likewise, when input signal VDDBAT is at 2.0 volts, transistor MN1 turns on, pulling node N1 to ground and causing node Z to be a logical "1."

It is to be appreciated that the voltage level detection techniques of the present invention described herein may be used with alternative circuit configurations for detecting other voltage levels, as will be understood by those skilled in the art.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A detection circuit configurable for comparing a first voltage supply with at least a second voltage supply applied to the circuit and for indicating a voltage level of the second voltage supply, the detection circuit comprising:
   at least one transistor, the at least one transistor including a first bias terminal connecting to the first voltage supply, a control terminal for receiving the second voltage supply, and a second bias terminal operatively coupled to an output of the circuit; and
   a passive load connected between the second bias terminal of the at least one transistor and a third voltage supply;
   wherein the detection circuit is configured to generate an output signal at the output of the circuit, the output signal being at a first logic value indicating that the second voltage supply is substantially at a first voltage level, and the output signal being at a second logic value indicating that the second voltage supply is substantially at a second voltage level, the first and second voltage levels defining an operating voltage range of the second voltage supply;
   wherein when the second voltage supply is at one of the first and second levels, the detection circuit draws substantially no current.

2. The circuit of claim 1, wherein the first voltage supply is a positive voltage supply and the third voltage supply is a negative voltage supply with respect to the first voltage supply.

3. The circuit of claim 1, further comprising a buffer circuit connected in series between the second bias terminal of the at least one transistor and the output of the circuit.

4. The circuit of claim 1, further comprising an inverter operatively connected in series between the second bias terminal of the at least one transistor and the output of the circuit.

5. The circuit of claim 1, wherein the passive load comprises a resistor including a first terminal connected to the second bias terminal of the at least one transistor and a second terminal connected to the third voltage supply.

6. The circuit of claim 1, wherein the at least one transistor comprises a p-type metal-oxide-semiconductor (PMOS) device, and wherein the first and second bias terminals and the control terminal of the at least one transistor comprises source, drain and gate terminals, respectively, of the PMOS device.

7. The circuit of claim 1, wherein the at least one transistor comprises an n-type metal-oxide-semiconductor (NMOS) device, and wherein the first and second bias terminals and the control terminal of the at least one transistor comprises source, drain and gate terminals, respectively, of the NMOS device.

8. The circuit of claim 1, wherein the first voltage level is about 1.8 volts and the second voltage level is about 3.3 volts.

9. The circuit of claim 1, further comprising a voltage level shift circuit connected between the first voltage supply and the first bias terminal of the at least one transistor, the voltage level shift circuit being operative to generate a voltage drop between the first voltage supply and the first bias terminal of the at least one transistor.

10. The circuit of claim 9, wherein the voltage drop generated by the voltage level shift circuit is greater than or equal to a difference between a maximum tolerance limit of the first voltage supply and a minimum tolerance limit of a highest expected voltage level of the second voltage supply.

11. The circuit of claim 9, wherein the voltage level shift circuit is configurable for receiving a control signal, the voltage level shift circuit being operative to selectively vary the voltage drop in response to the control signal.

12. A detection circuit configurable for indicating a voltage level of an input signal applied to the circuit, the circuit comprising:
   at least one transistor, the at least one transistor including a first terminal connected to a first voltage supply, a second terminal configured for receiving the input signal, and a third terminal operatively coupled to an output of the circuit;
   a passive load connected between the third terminal of the at least one transistor and a second voltage supply; and
   a voltage level shift circuit connected between the first voltage supply and the first terminal of the at least one transistor, the voltage level shift circuit being operative to generate a voltage drop between the first voltage supply and the first terminal of the at least one transistor;
   wherein the detection circuit is configured to generate an output signal at the output of the detection circuit, wherein the output signal being at a first value indicates that the input signal is substantially at a first voltage level, and wherein the output signal being at a second value indicates that the input signal is substantially at a second voltage level;
   wherein the voltage level shift circuit comprises:
      a second transistor, the second transistor including a first terminal connected to the first terminal of the at least one transistor, the second transistor including second and third terminals connected to the first voltage supply of the detection circuit; and
      a second passive load connected between the first terminal of the second transistor and the second voltage supply.

13. The circuit of claim 12, wherein the voltage level shift circuit further comprises a switch including a first terminal connected to the first voltage supply, a second terminal connected to the first terminal of the second transistor, and a third terminal configured for receiving a control signal presented to the switch, the switch being operative to selectively provide an electrical connection between the first and second terminals of the switch in response to the control signal.

14. The circuit of claim 12, wherein the voltage level shift circuit further comprises a third transistor, the third transistor including first and second terminals connected to the first and second terminals, respectively, of the second transistor, and a third terminal configured for receiving the input signal, the third transistor being operative to selectively shunt the second transistor in response to the input signal.

15. An integrated circuit device including at least one detection circuit configurable for comparing a first voltage supply with at least a second voltage supply applied to the circuit and for indicating a voltage level of the second voltage supply, the at least one detection circuit comprising:
   at least one transistor, the at least one transistor including a first bias terminal connecting to the first voltage supply, a control terminal for receiving the second voltage supply, and a second bias terminal operatively coupled to an output of the circuit; and
   a passive load connected between the second bias terminal of the at least one transistor and a third voltage supply;
   wherein the detection circuit is configured to generate an output signal at the output of the circuit, the output signal being at a first logic value indicating that the second voltage supply is substantially at a first voltage level, and the output signal being at a second logic value indicating that the second voltage supply is substantially at a second voltage level, the first and second voltage levels defining an operating voltage range of the second voltage supply;
   wherein when the second voltage supply is at one of the first and second levels, the detection circuit draws substantially no current.

16. The device of claim 15, wherein the at least one transistor comprises one of a p-type metal-oxide-semiconductor (PMOS) transistor and an n-type metal-oxide-semiconductor (NMOS) transistor, and wherein the first and second bias terminals and the control terminal of the at least one transistor comprises source, drain and gate terminals, respectively, of the PMOS and NMOS transistors.

17. The device of claim 15, wherein the at least one detection circuit further comprises a voltage level shift circuit connected between the first voltage supply and the first bias terminal of the at least one transistor, the voltage level shift circuit being operative to generate a voltage drop between the first voltage supply and the first bias terminal of the at least one transistor.

18. The device of claim 17, wherein the voltage drop generated by the voltage level shift circuit is greater than or equal to a difference between a maximum tolerance limit of the first voltage supply and a minimum tolerance limit of a highest expected voltage level of the second voltage supply.

19. The device of claim 17, wherein the voltage level shift circuit is configurable for receiving a control signal, the voltage level shift circuit being operative to selectively vary the voltage drop in response to the control signal.

20. An integrated circuit device including at least one detection circuit configurable for indicating a voltage level of an input signal applied to the circuit, the at least one detection circuit comprising:
   at least one transistor, the at least one transistor including a first terminal connected to a first voltage supply, a second terminal configured for receiving the input signal, and a third terminal operatively coupled to an output of the circuit;
   a passive load connected between the third terminal of the at least one transistor and a second voltage supply; and
   a voltage level shift circuit connected between the first voltage supply and the first terminal of the at least one transistor, the voltage level shift circuit being operative to generate a voltage drop between the first voltage supply and the first terminal of the at least one transistor;
   wherein the circuit is configured to generate an output signal at the output of the circuit, wherein the output signal being at a first value indicates that the input signal is substantially at a first voltage level, and wherein the output signal being at a second value indicates that the input signal is substantially at a second voltage level wherein the voltage level shift circuit comprises:

a second transistor, the second transistor including a first terminal connected to the first terminal of the at least one transistor, the second transistor including second and third terminals connected to the first voltage supply of the detection circuit; and a second passive load connected between the first terminal of the second transistor and the second voltage supply.

21. The circuit of claim 20, wherein the voltage level shift circuit further comprises a switch including a first terminal connected to the first voltage supply, a second terminal connected to the first terminal of the second transistor, and a third terminal configured for receiving a control signal presented to the switch, the switch being operative to selectively provide an electrical connection between the first and second terminals of the switch in response to the control signal.

22. The circuit of claim 20, wherein the voltage level shift circuit further comprises a third transistor, the third transistor including first and second terminals connected to the first and second terminals, respectively, of the second transistor, and a third terminal configured for receiving the input signal, the third transistor being operative to selectively shunt the second transistor in response to the input signal.

* * * * *